United States Patent [19]
Hori

[11] Patent Number: 5,232,532
[45] Date of Patent: Aug. 3, 1993

[54] CHIP DEVICE BONDING MACHINE

[75] Inventor: Takeshi Hori, Kanagawa, Japan

[73] Assignee: Sony Corporation, Tokyo, Japan

[21] Appl. No.: 887,844

[22] Filed: May 26, 1992

[30] Foreign Application Priority Data

May 27, 1991 [JP] Japan ................... 3-120847

[51] Int. Cl.$^5$ .............................. B32B 31/00
[52] U.S. Cl. .......................... 156/163; 156/87;
156/295; 156/358; 156/362; 156/556; 29/740;
29/741; 29/832; 29/853
[58] Field of Search ............... 156/87, 160, 163, 295,
156/556, 323, 350, 358, 632; 29/740, 741, 742,
832, 840, 853; 437/209; 361/400

[56] References Cited

U.S. PATENT DOCUMENTS

| | | |
|---|---|---|
| 3,855,034 | 12/1974 | Miller . |
| 4,216,577 | 8/1980 | Badet et al. .............. 264/272.17 |
| 4,526,646 | 7/1985 | Suzuki et al. .............. 29/740 |
| 4,672,742 | 6/1987 | Juan .............. 156/362 |
| 4,749,120 | 6/1988 | Hatada . |
| 4,913,336 | 4/1990 | Yamazaki . |

FOREIGN PATENT DOCUMENTS 1-297828 11/1989 Japan .
2-181447 7/1990 Japan .

*Primary Examiner*—David A. Simmons
*Assistant Examiner*—Paul M. Rivard
*Attorney, Agent, or Firm*—Hill, Steadman & Simpson

[57] ABSTRACT

The present invention is to provide a chip device bonding machine in which bubbles can be effectively prevented from remaining with the adhesive. A flexible board is moved on a base at every unit by the rotation of reels. In accordance with the movement of the flexible board, a new portion of a tape made of a film, a paper or the like is moved above the base. The tape is located between the flexible board and the base. A thermosetting adhesive is deposited on the flexible board on the base by an adhesive nozzle. An IC chip is placed on the flexible board on the base by an IC chip supply arm. A pressing arm including a heater presses and heats the IC chip toward the base side to interconnect the IC chip to the flexible hoard. When the IC chip is heated and pressed by the pressing arm, the tape is concaved at its portions corresponding to bumps and consequently the flexible board is deformed, whereby bubbles produced within the adhesive are pushed out to the outside. Thus, the bubbles can be removed from the adhesive.

7 Claims, 4 Drawing Sheets

CHIP DEVICE BONDING MACHINE

BACKGROUND OF THE INVENTION

1. Field of the Invention

The present invention relates generally to flip chip bonding machines and, more particularly to a chip device bonding machine for bonding chip-shaped electronic assembly parts such as ICs or the like to a flexible board and a method thereof.

2. Description of the Prior Art

IC cards in which an IC chip is housed in a plastic card are proposed. When the IC card is manufactured, an electrode of IC chip must be interconnected to a wiring pattern of the board.

FIG. 1 of the accompanying drawings shows an example of a conventional interconnection method which utilizes a wire bonding technique.

In FIG. 1, reference numeral 1 depicts a flexible board and 2 a wiring pattern formed on the flexible board 1. An IC chip 3 is secured to the flexible board 1 by an adhesive 7 and then an electrode 3a of the IC chip 3 and the wiring pattern 2 are interconnected by means of a gold wire 5.

According to the prior-art wire bonding interconnection method, the gold wire 5 occupies a predetermined space, which unavoidably increases the thickness of the product (IC card). In order to solve this problem, an interconnection method utilizing a flip chip bonding (face-down bonding) technique, which is one of the wireless bonding techniques, is proposed.

FIGS. 2A and 2B of the accompanying drawings show a conventional interconnection method utilizing the flip chip bonding technique. In FIGS. 2A and 2B, like parts corresponding to those of FIG. 1 are marked with the same references and therefore need not be described in detail. Bumps 6 are interconnected to the wiring pattern 2 at its positions corresponding to the electrodes 3 a of the IC chip 3. A thermosetting adhesive 7 is deposited on the flexible board 1 at its position corresponding to the position at which the IC chip 3 is set, as shown in FIG. 2A.

Then, the IC chip 3 is set on the flexible board 1 such that the electrodes 3 a are faced to the bumps 6. The IC chip 3 is heated at a thermosetting temperature of the adhesive 7 and applied with a pressure so that the adhesive 7 between the electrode 3 a of the IC chip 3 and the bump 6 may be removed. Thus, the IC chip 3 is secured on the flexible board 1 and the electrodes 3 a of the IC chip 3 are interconnected to the wiring pattern through the bumps 6 as shown in FIG. 2B.

In the above-mentioned flip chip bonding process, when the adhesive 7 is heated, it is frequently observed that bubbles (chemical gas or air) are produced from the adhesive 7 and remain in the adhesive 7 between the flexible board 1 and the IC chip 3. FIGS. 3A and 3B show the condition such that bubbles 8 remain in the adhesive 7 between the flexible board 1 and the IC chip 3. FIG. 3A is a longitudinal cross-sectional view and FIG. 3B is a bottom view with the flexible board 1 being omitted.

When the bubble 8 remains between the flexible board 1 and the IC chip 3, the bubble 8 is expanded and contracted in response to the change of temperature, thereby causing the interconnection portion to be cracked or peeled off. As a result, reliability of the interconnection is deteriorated.

Therefore, according to the conventional technique, in order to remove the bubbles 8, the amount of the adhesive 7 is increased or a lot of time is spent for the heating and pressing process, which uselessly consumes the adhesive 7 or deteriorates the efficiency of manufacturing.

OBJECTS AND SUMMARY OF THE INVENTION

Therefore, it is an object of the present invention to provide an improved chip device bonding machine in which the aforesaid shortcomings and disadvantages encountered with the prior art can be eliminated.

More specifically, it is an object of the present invention to provide a chip device bonding machine which can effectively prevent bubbles from remaining in the adhesive between a flexible board and an IC chip.

It is another object of the present invention to provide a chip device bonding machine in which efficiency of manufacturing can be increased.

It is still another object of the present invention to provide a chip device bonding machine in which reliability of interconnection can be improved.

According to an aspect of the present invention, a chip device bonding machine is comprised of board supplying means for supplying a flexible board, an adhesive nozzle for depositing a thermosetting adhesive on the flexible board, an electronic parts supply arm for placing chip-shaped electronic parts on the flexible board on which the adhesive is deposited, sheet supplying means for supplying a sheet-shaped member to the flexible board on its surface opposite to the surface on which the electronic parts are placed, and a pressing arm for heating and pressing the electronic parts set on the flexible board.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

Figure 1:
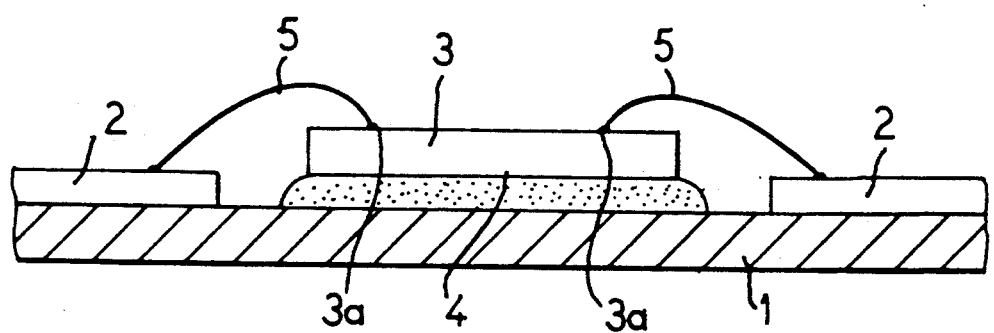
FIG. 1 is a diagram used to illustrate an interconnection method utilizing a wire bonding technique according to the prior art.
Figure 3A:
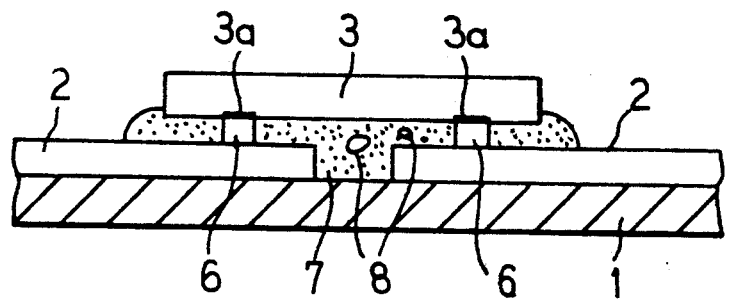
FIGS. 3A and 3B are respectively a longitudinal cross-sectional view and a bottom view in which the flexible board is omitted, and illustrating the condition such that bubbles remain in the adhesive between the flexible board and the IC chip.
Figure 3B:
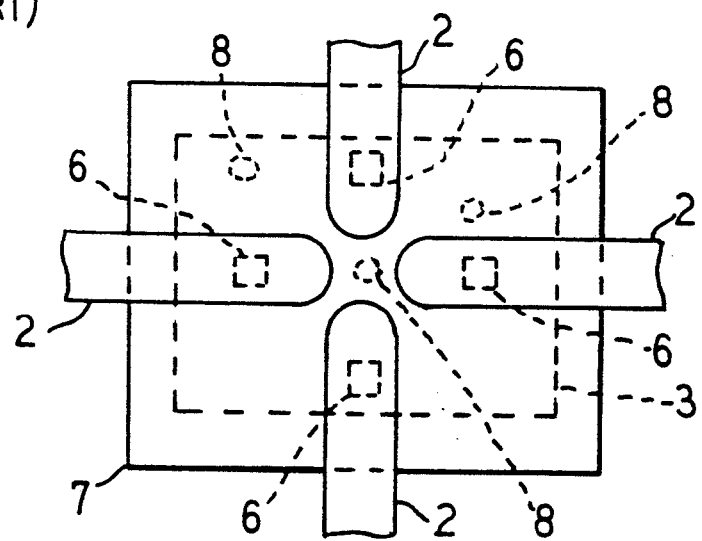
Figure 4:
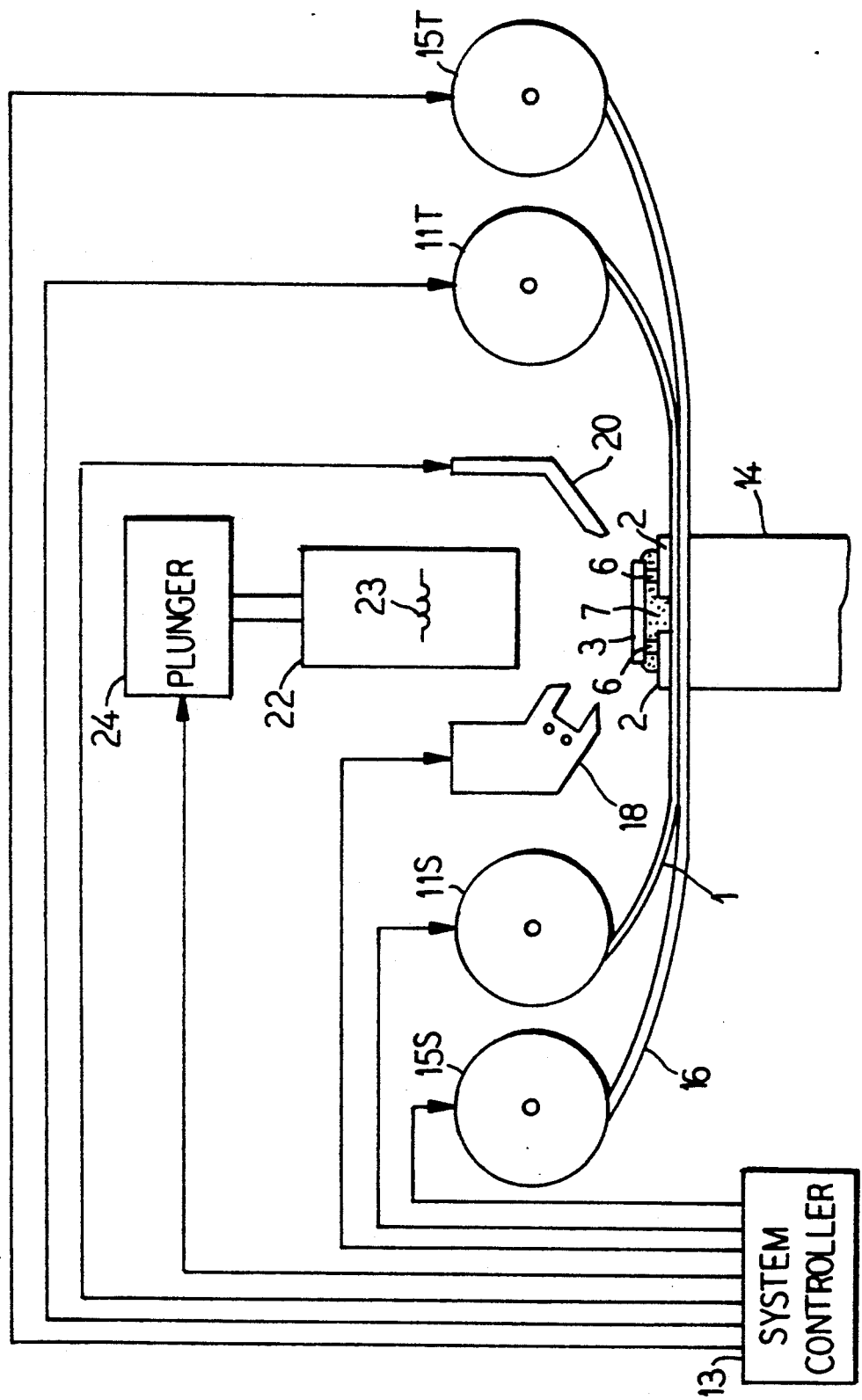
FIG. 4 is a schematic diagram showing an arrangement of a chip device bonding machine according to an embodiment of the present invention.

A chip device bonding machine according to an embodiment of the present invention will hereinafter be described in detail with reference to FIG. 4. Also in FIG. 4, like parts corresponding to those of FIGS. 1 through 3 are marked with the same references and therefore need not be described in detail. Referring to FIG. 4, there are provided a supply reel 11S for supplying the flexible board 1 and a take-up reel 11T for taking up the flexible board 1. These supply and take-up reels 11S and 11T are rotated under the control of a system controller 13.

Figure 2A:
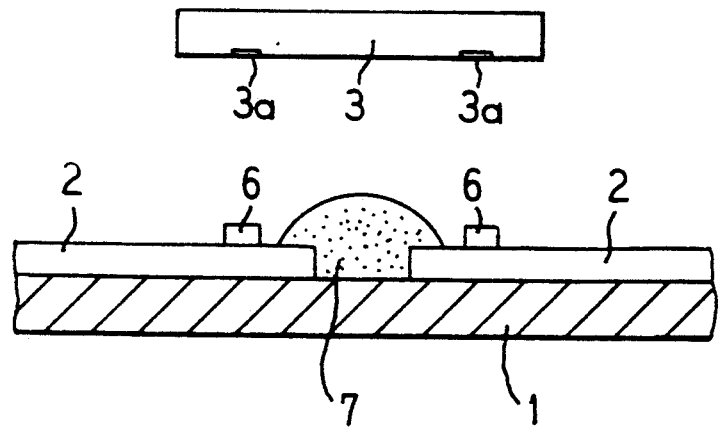
FIGS. 2A and 2B are respectively diagrams used to illustrate an interconnection method utilizing a flip chip bonding technique according to the prior art.
Figure 2B:
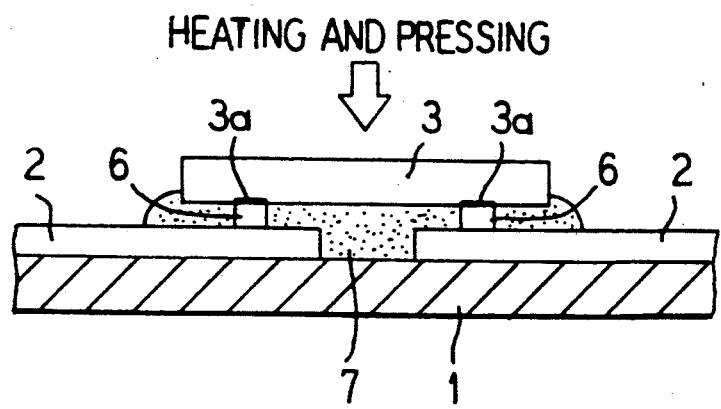

The flexible board 1 is composed of a plurality of successive units in each of which the wiring patterns 2 and the bumps 6 are fixed in advance (see FIGS. 2A and 2B). The flexible board 1 is moved on a base 14 at every unit in accordance with the rotation of the reels 11S and 11T.

In FIG. 4, reference numerals 15S and 15T respectively depict a supply reel and a take-up reel for a tape (sheet-like member) 16 made of a film, a paper or the like. The rotation of these reels 15S and 15T is controlled by the system controller 13.

The tape 16 is located between the base 14 and the flexible board 1. As a new unit of the flexible board 1 is moved on the base 14, a new portion of the tape 16 is moved the base 14 by the rotation of the reels 15S and 15T.

An IC chip supply arm 18 is adapted to place the IC chip 3 (see FIGS. 2A and 2B) on the flexible board 1. Operation of the IC chip supply arm 18 is controlled by the system controller 13.

An adhesive nozzle 20 is adapted to deposit a thermosetting adhesive 7 (see FIGS. 2A and 2B) such as an epoxy resin or the like on the flexible board 1. Operation of the adhesive nozzle 20 is controlled by the system controller 13.

A pressing arm 22 houses therein a heater 23. Pressing operation of the pressing arm 22 is effected by a plunger 24 which is controlled by the system controller 13.

According to the above-mentioned arrangement, a new unit of the flexible board 1 is moved on the base 14 by the rotation of the reels 11S and 11T. Also, a new portion of the tape 16 is moved on the base 14 by the rotation of the reels 15S and 15T.

Then, the adhesive nozzle 20 is moved above the unit of the flexible hoard 1 on the base 14 and the thermosetting adhesive 7 is deposited on the unit.

In the next process, the IC chip 3 is placed on the unit of the flexible board 1 on the base 14 by the IC chip supply arm 18. At that time the electrode 3 a of the IC chip 3 is opposed to the bump 6 interconnected on the wiring pattern.

The pressing arm 22 is moved toward the base 14 side by the plunger 24 and the IC chip 3 is pressed to the base 14 side while it is being heated. As a consequence, the electrode 3 a of the IC chip 3 is brought in contact with the bump 6 and then interconnected to the wiring pattern 2. Under this condition, the IC chip 3 is secured to the flexible board 1 when the adhesive 7 is heated and then cured.

The above-mentioned bonding operation is effected each time the unit of the flexible board 1 is sequentially moved on the base 14.

Figure 5A:
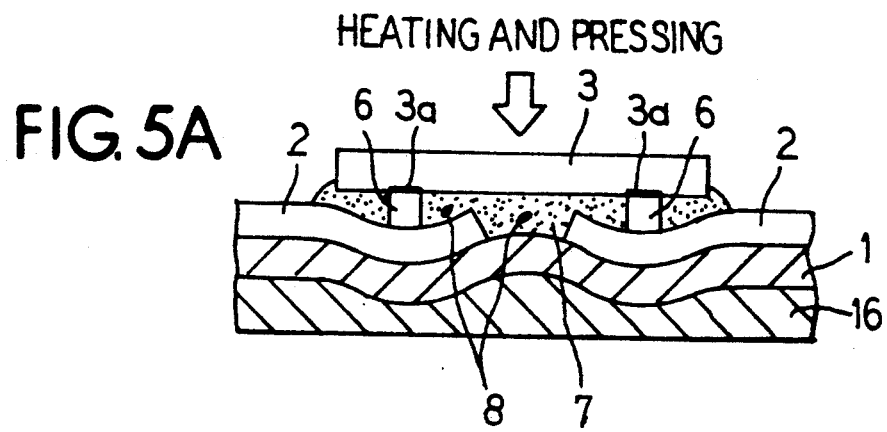
FIGS. 5A and, 5B are longitudinal cross-sectional views used to illustrate how to push out bubbles.

According to this embodiment, the tape 16 is located between the base 14 and the flexible board 1. Thus, when the IC chip 3 is heated and pressed by the pressing arm 22, as shown in FIG. 5A, the tape 16 is concaved at its portions corresponding to the bumps 6 so that the flexible board 1 is deformed so as to project a central portion thereof corresponding to a portion between the bumps 6, 6.

Figure 5B:
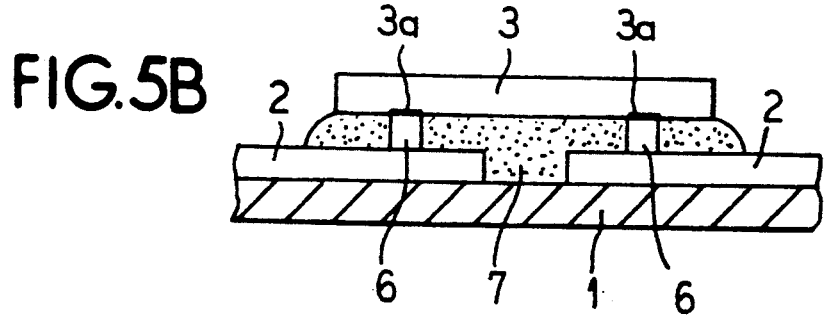

As a result, the bubbles 8 produced within the adhesive 7 are pushed out to the outside and no bubbles 8 remain within the adhesive 7 at the completion of the bonding operation as shown in FIG. 5B.

As described above, according to the flip chip bonding machine of this embodiment, the bubbles 8 can be effectively prevented from being left within the adhesive 7 and therefore reliability of the interconnection can be improved. Further, as compared with the prior-art technique in which the amount of the adhesive 7 is increased and the adhesive 7 and the IC chip 3 are heated and pressed during a long period of time, according to the present invention, the adhesive 7 can be more efficiently utilized and efficiency of manufacturing can be increased.

While the IC chip 3 is interconnected to and secured to the flexible board 1 in the above-mentioned embodiment, the present invention is not limited thereto and the flip chip bonding machine of the present invention can be similarly applied to the case such that other chip-shaped electronic parts are interconnected to and secured to the flexible board.

According to the above-mentioned embodiment, the flexible board 1 is moved and the tape 16 also is moved, thereby new portions of the tape 16 being utilized sequentially. When the concaved portion of the tape 16 has sufficient force of restitution, the same portion of the tape 16 can be utilized a plurality of times, before being advanced.

While the flexible board is composed of a plurality of units, supplied by the supply reel and taken up by the take-up reel as described above, the present invention is not limited thereto and such a variant is also possible. That is, for example, the flexible board might be formed of a single unit, or plural flexible boards might be supplied one by one.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A chip device bonding machine for bonding a chip device on a flexible board comprising:
   (a) board supplying means for supplying said flexible board having first and second surfaces on a base, said first surface having a wiring pattern and a bump interconnected with said wiring pattern;
   (b) adhesive depositing means for depositing a thermosetting adhesive on said first surface of said flexible board;
   (c) chip device mounting means for mounting a chip device on said first surface of said flexible board on which said thermosetting adhesive is deposited;
   (d) sheet putting means for putting a sheet on said second surface of said flexible board; and
   (e) pressing means for pressing said chip device on said flexible board and heating said chip device on said flexible board, said flexible board and said sheet are deformed by the press of said pressing means so as to push out bubbles produced within said adhesive to the outside; and
   (f) control means for controlling operation of said board supplying means, said adhesive depositing means, said chip device mounting means, said sheet putting means and said pressing means.

2. A chip device bonding machine for bonding a chip device on a flexible board comprising:
   (a) board supplying means for supplying said flexible board having first and second surfaces on a base, said first surface having a wiring pattern and a bump interconnected with said wiring pattern;
   (b) adhesive depositing means for depositing a thermosetting adhesive on said first surface of said flexible board;
   (c) chip device mounting means for mounting a chip device on said first surface of said flexible board on which said thermosetting adhesive is deposited so that an electrode of said chip device is opposed to said bump interconnected on said wiring pattern;
   (d) sheet putting means for putting a sheet on said second surface of said flexible board;
   (e) pressing means for pressing said chip device on said flexible board so as to bring said electrode of said chip device into contact with said bump and for heating said chip device on said flexible board, said sheet is concaved at portions corresponding to said bumps so that said flexible board is deformed so as to project a central portion thereof corresponding to a portion between said bumps; and
   (f) control means for controlling operation of said board supplying means, said adhesive depositing means, said chip device mounting means, said sheet putting means and said pressing means.

3. A method for bonding a chip device on a flexible board, comprising the steps of:
   (a) supplying a flexible board having first and second surfaces to a base, said first surface having a wiring pattern and a bump interconnected with said wiring pattern;
   (b) depositing a thermosetting adhesive on said first surface of said flexible board;
   (c) mounting a chip device on said first surface of said flexible board on which said thermosetting adhesive is deposited so that an electrode of said chip device is opposed to said bump interconnected with said wiring pattern;
   (d) putting a sheet on said second surface of said flexible board;
   (e) pressing said chip device on said flexible board so as to bring said electrode of said chip device into contact with said bump and heating said chip device on said flexible board, said sheet is concaved at portions corresponding to said bumps so that said flexible board is deformed so as to project a central portion thereof corresponding to a portion between said bumps.

4. The chip device bonding machine according to claim 1, wherein said board supplying means comprises:
   (a) a board supply reel for supplying said flexible board and
   (b) a board take-up reel for taking up said flexible board; said control means controlling rotation of said board feed supply reel and said board take-up reel.

5. The chip device bonding machine according to claim 1, wherein said sheet putting means comprises:
   (a) a sheet supply reel for supplying said sheet and
   (b) a sheet take-up reel for taking up said sheet; said control means controlling rotation of said sheet supply reel and said sheet take-up reel.

6. A chip device bonding machine according to claim 1, wherein said pressing means comprises:
   (a) a heater for heating said chip device on said flexible board, and
   (b) heater shift means for shifting said heater between first and second positions, said heater shift means contacting said heater at said first position, said control means controlling operation of said heater and said heater shift means.

7. A chip device bonding machine for bonding a chip device on a flexible board comprising:
   (a) board supplying reel for supplying said flexible board having first and second surfaces on a base, said first surface having a wiring pattern and a bump interconnected with said wiring pattern;
   (b) a board take-up reel for taking up said flexible board;
   (c) an adhesive depositing nozzle for depositing a thermosetting adhesive on said first surface of said flexible board;
   (d) a chip device mounting arm for mounting a chip device on said first surface of said flexible board on which said thermosetting adhesive is deposited so that an electrode of said chip device is opposed to said bump interconnected with said wiring pattern;
   (e) a sheet supplying reel for supplying sheet between said second surface of said flexible board to said base;
   (f) a sheet take-up reel for taking up said sheet;
   (g) a pressing for pressing said chip device on said flexible board so as to bring said electrode of said chip device into contact with said bump and for heating said chip device on said flexible board, said sheet is concaved at portions corresponding to said bumps so that said flexible board is deformed so as to project a central portion thereof corresponding to a portion between said bumps; and
   (h) control means for controlling operation of said board supplying means, said adhesive depositing means, said chip device mounting means, said sheet putting means and said pressing means.

* * * * *